(12) United States Patent
Bukesov

(10) Patent No.: US 7,777,244 B2
(45) Date of Patent: Aug. 17, 2010

(54) SIDE-VIEW LIGHT EMITTING DIODE PACKAGE HAVING A REFLECTOR

(75) Inventor: Sergey Bukesov, Seoul (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 37 days.

(21) Appl. No.: 12/293,328

(22) PCT Filed: Mar. 16, 2007

(86) PCT No.: PCT/KR2007/001310

§ 371 (c)(1),
(2), (4) Date: Sep. 17, 2008

(87) PCT Pub. No.: WO2007/108616

PCT Pub. Date: Sep. 27, 2007

(65) Prior Publication Data
US 2009/0200566 A1      Aug. 13, 2009

(30) Foreign Application Priority Data
Mar. 17, 2006  (KR) .................. 10-2006-0024670
Mar. 31, 2006  (KR) .................. 10-2006-0029513

(51) Int. Cl.
  *H01L 33/00*     (2010.01)
(52) U.S. Cl. ................... 257/98; 257/E33.072
(58) Field of Classification Search ............ 257/98, 257/E33.072
See application file for complete search history.

(56) References Cited

U.S. PATENT DOCUMENTS

| 6,552,368 | B2 | 4/2003 | Tamai et al. |
| 6,878,972 | B2 | 4/2005 | Waalib-Singh et al. |
| 7,319,245 | B2 * | 1/2008 | Brunner et al. ............ 257/98 |

FOREIGN PATENT DOCUMENTS

| JP | 2004-265980 | 9/2004 |
| TW | 533602 | 5/2003 |

OTHER PUBLICATIONS

Taiwanese Preliminary Notice of the First Office Action dated Mar. 25, 2010.

\* cited by examiner

*Primary Examiner*—Mark Prenty
(74) *Attorney, Agent, or Firm*—H.C. Park & Associates, PLC

(57) ABSTRACT

Disclosed herein is a side-view light emitting diode package with a reflector. The side-view light emitting diode package of the present invention comprises first and second lead terminals spaced apart from each other. The package body supports the first and second lead terminals and has an elongated opening through which a light emitting diode chip mounting region and the first and second lead terminals are exposed. Reflectors are formed between the chip mounting region and sidewalls positioned in a major axis direction of the opening. Each of the reflectors has a height lower than that of the sidewall of the opening. Accordingly, light emitted from a light emitting diode chip can be reflected using the reflectors, thereby improving light emitting efficiency of the side-view light emitting diode package.

16 Claims, 5 Drawing Sheets

(a)           (b)           (c)

SIDE-VIEW LIGHT EMITTING DIODE PACKAGE HAVING A REFLECTOR

CROSS REFERENCE RELATED APPLICATIONS

This application is the National Stage of International Application No. PCT/KR2007/001310, filed Mar. 16, 2007, and claims priority from and the benefit of Korean Patent Application No. 10-2006-0024670, filed on Mar. 17, 2006, and Korean Patent Application No. 10-2006-0029513, filed on Mar. 31, 2006, which are all hereby incorporated by reference for all purposes as if fully set forth herein.

BACKGROUND OF THE INVENTION

1. Field of the Invention

The present invention relates to a side-view light emitting diode package, and more particularly, to a side-view light emitting diode package capable of maximizing light emitting efficiency using a reflector provided therein.

2. Discussion of the Background

In general, a lighting system using a light emitting diode chip is formed by mounting a light emitting diode (LED) chip on each of various packages depending on its use. A side-view light emitting diode package is widely used in a backlight for a display since it is suitable for being disposed on a side surface of a light guide plate to provide light parallel to the light guide plate.

However, the conventional side-view light emitting diode package has problems in that emission intensity and light efficiency is lowered since lights emitted from a light emitting diode chip are absorbed or scattered by a package body. Therefore, it is required to make continuous attempts to improve light emitting efficiency of the side-view light emitting diode package.

SUMMARY OF THE INVENTION

The present invention-provides a side-view light emitting diode package with improved light emitting efficiency.

The present invention also provides a side view light emitting diode package for laterally emitting light from a light diode chip.

Additional features of the invention will be set forth in the description which follows, and in part will be apparent from the description, or may be learned by practice of the invention.

The present invention discloses a side-view light emitting diode package for laterally emitting light emitted from a light emitting diode chip including a first and second lead terminal spaced apart from each other, a package body supporting the first and second lead terminals and having an elongated opening through which a light emitting diode chip mounting region and sidewalls positioned in a major axis direction of the opening and each having a height lower than that of the sidewall of the opening.

The present invention also discloses a side-view light emitting diode package for laterally emitting light emitted from a light emitted diode chip including a first and second lead terminal spaced apart from each other, a package body supporting the first and second lead terminals and having an elongated opening through which a light emitting diode chip mounting region and the first and second lead terminals are exposed and an oxide layer formed on at least a portion of inner surfaces surrounding the opening, and reflectors formed between the light emitting diode chip mounting region and sidewalls positioned in a major axis direction of the opening and each having a height lower than that of the sidewall of the opening.

It is to be understood that both the foregoing general description and the following detailed description are exemplary and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DESCRIPTION OF THE ILLUSTRATED EMBODIMENTS

Figure 1:
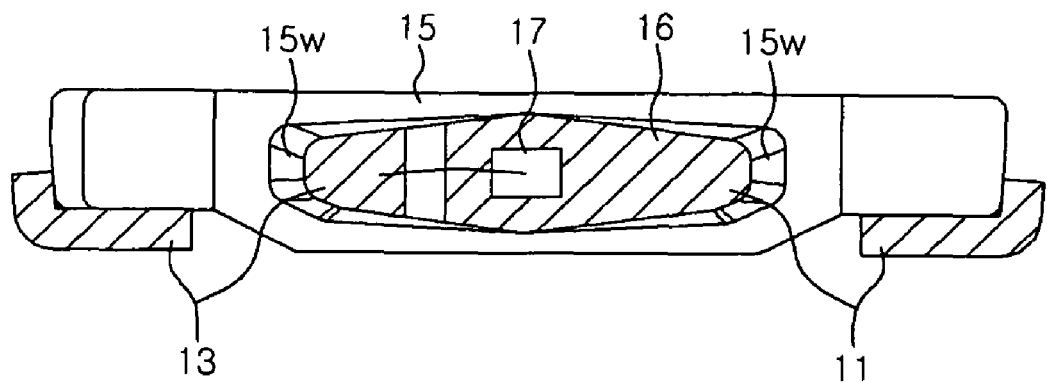
FIG. 1 is a plan view illustrating a side-view light emitting diode package according to the prior art.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 2:
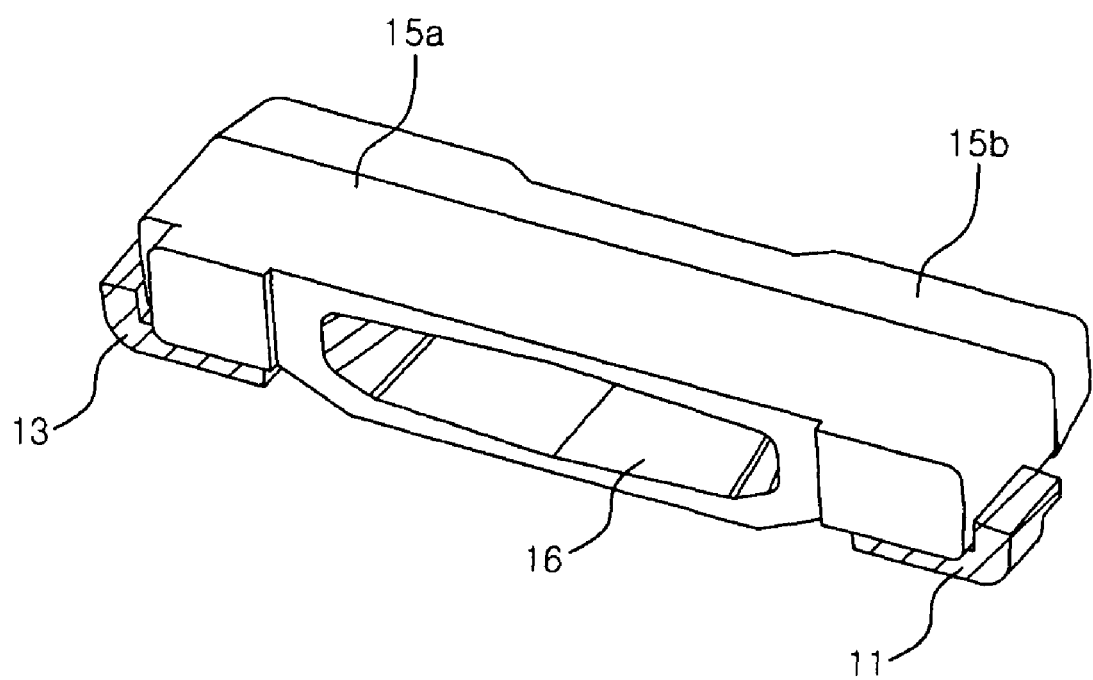
FIG. 2 is a perspective view illustrating a side-view light emitting diode package according to the prior art.

FIGS. 1 and 2 are plan and perspective views illustrating a conventional side-view light emitting diode package.

Referring to FIGS. 1 and 2, a side-view light emitting diode package comprises a pair of lead terminals, i.e. first and second lead terminals 11 and 13. The first and second lead terminals 11 and 13 are supported on a package body 15. The package body 15 can be formed by insert-molding the lead terminals.

For convenience of explanation, the package body 15 may be divided into upper and lower package bodies 15a and 15b based on positions of the first and second lead terminals 11 and 13.

The upper package body 15a has an opening 16 through which the first and second lead terminals 11 and 13 are exposed. The first and second lead terminals 11 and 13 are positioned on the bottom of the opening 16, i.e. on the lower package body 15b, and are spaced apart from each other within the opening. Further, the first and second lead terminals 11 and 13 protrude outwardly from the package body 15 such that they are electrically connected to an external power source. The outwardly protruding lead terminals 11 and 13 may be formed or bent into various shapes. FIGS. 1 and 2 illustrate lead terminals 11 and 13 bent from a lower surface to a side surface of the package body 15.

A light emitting diode chip 17 is mounted on and electrically connected to the first lead terminal 11 in the opening 16, and is then electrically connected to the second lead terminal 13 through a bonding wire. The opening 16 may be filled with a transparent resin, and phosphors may be incorporated in the transparent resin.

A conventional side-view light emitting diode package comprises an elongated opening 16 and its sidewalls, particularly its sidewalls 15w positioned in a major axis direction, are formed to incline such that a viewing angle in the major axis direction increases. Accordingly, a side-view light emitting diode package suitable for a backlight for display is provided, and a side-view light emitting diode package capable of emitting white light can also be provided by properly selecting a light emitting diode chip and phosphors.

Figure 3:
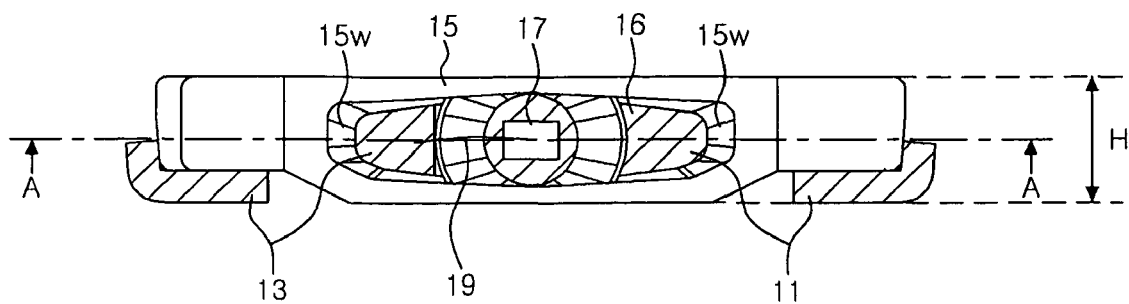
FIG. 3 is a plan view illustrating a side-view light emitting diode package according to a first embodiment of the present invention.
Figure 4:
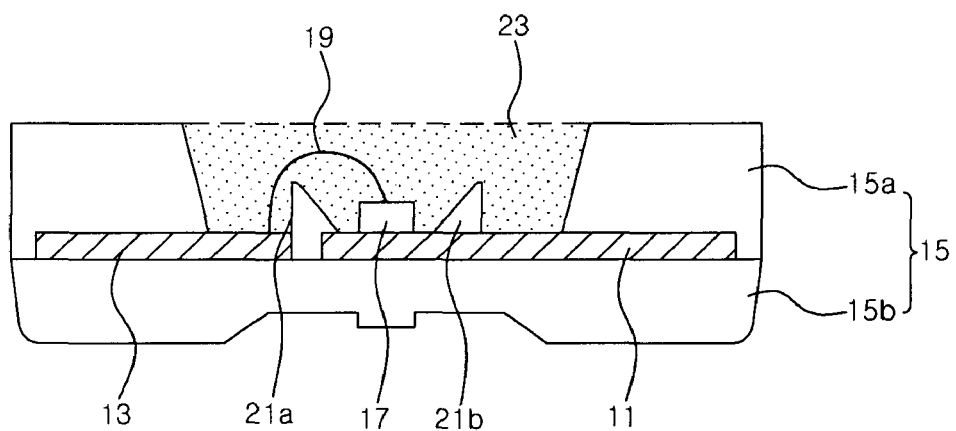
FIG. 4 is a sectional view of the side-view light emitting diode package taken along line A-A of FIG. 3.

FIG. 3 is a plan view illustrating a side-view light emitting diode package provided with reflectors 21a and 21b according to an embodiment of the present invention, and FIG. 4 is a sectional view taken along line A-A of FIG. 3. Here, reference numeral H indicates the height of the side-view light emitting diode package when it is mounted.

Referring to FIGS. 3 and 4, the side-view light emitting diode package comprises a pair of lead terminals, i.e. first and second lead terminals 11 and 13. The first and second lead terminals 11 and 13 are supported by a package body 15. The package body 15 may be formed by insert-molding the lead terminals. For convenience of explanation, it is described herein that the package body 15 is divided into an upper package body 15a and a lower package body 15b based on positions of the first and second lead terminals 11 and 13.

The upper package body 15a has an opening 16 through which the first and second lead terminals 11 and 13 are exposed, and a chip mounting region is exposed by the opening 16. The first and second lead terminals 11 and 13 are formed on the bottom of the opening, i.e. on the lower package body 15b, and are spaced apart from each other in the opening 16. Further, the first and second lead terminals 11 and 13 protrude outwardly from the package body 15 such that the first and second lead terminals 11 and 13 are electrically connected to an external power source. The outwardly protruding lead terminals 11 and 13 may be formed and bent into various shapes. Herein, it is illustrated that the lead terminals 11 and 13 are bent from a lower surface to a side surface of the package body 15 such that light is emitted laterally with respect to a mounting surface of the package. However, the present invention is not limited thereto, and the lead terminals 11 and 13 may be bent to a lower surface of the package body 15 such that light is emitted upwardly with respect to the mounting surface of the package.

A light emitting diode chip 17 is mounted on the chip mounting region within the opening 16 and is electrically connected to the first and second lead terminals 11 and 13. As shown in the figure, the light emitting diode chip 17 may be mounted on the first lead terminal 11 and may be electrically connected to the second lead terminal 13 through a bonding wire 19. On the contrary, the light emitting diode chip 17 may be mounted on the lower package body 15b and then be electrically connected to the first and second lead terminals, respectively, by bonding wires.

Further, the side-view light emitting diode package according to this embodiment includes reflectors 21a and 21b. Each of the reflectors 21a and 21b is positioned between the chip mounting region and each sidewall 15w positioned in a major axis direction of the opening 16. Each of the reflectors 21a and 21b includes an inclined reflection surfaces for reflecting light emitted from the light emitting diode chip 17 and has a height lower than that of the sidewall of the opening 16, e.g. the sidewalls 15w positioned in the major axis direction of the opening 16.

The reflectors 21a and 21b may be formed together with the package body 15 while the package body 15 is formed by insert-molding the first and second lead terminals 11 and 13. Therefore, the reflectors 21a and 21b may be formed of a plastic material, e.g. polyphthalamide (PPA), which is the same material as the package body 15. Alternatively, the reflectors 21a and 21b may be formed of a metallic material with high reflectivity such as aluminum or silver. The reflectors are integrated into the package body by allowing the reflectors to be insert molded together with the first and second lead terminals 11 and 13 while the package body 15 is formed.

The bonding wire 19 can cross over the reflector 21a to connect the second lead terminal 13 and the light emitting diode chip 17.

Figure 5:
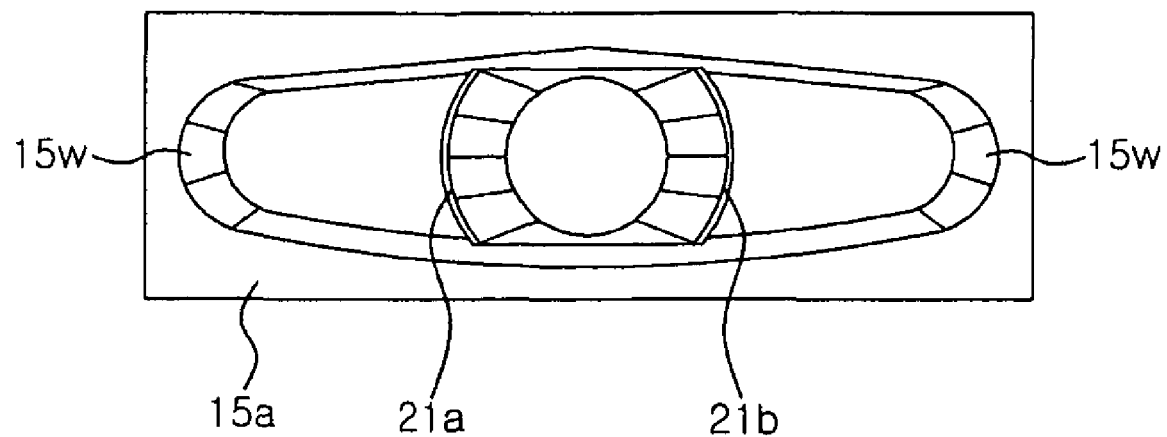
FIGS. 5 and 6 are schematic plan and perspective views illustrating the side-view light emitting diode package according to a second exemplary embodiment of the present invention.
Figure 6:
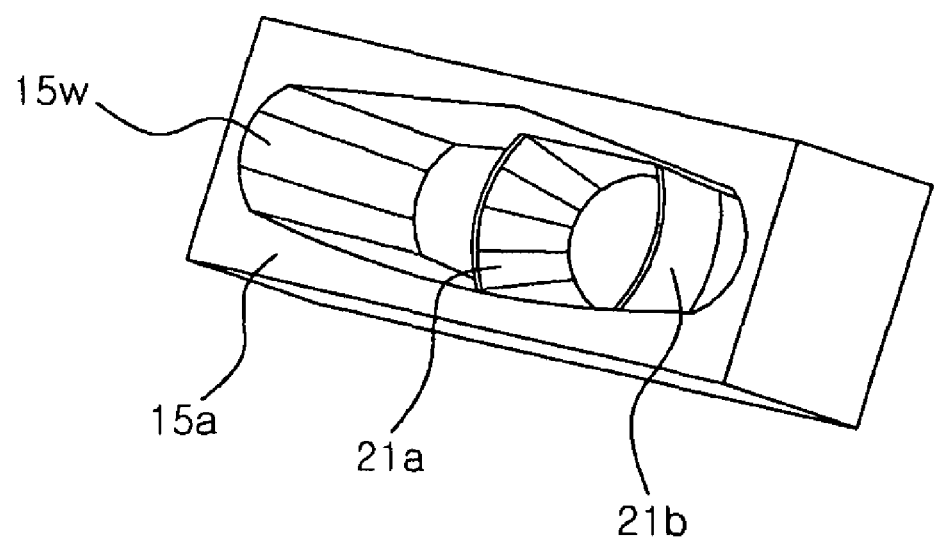

FIG. 5 is a schematic plan view of an upper package body 15a for illustrating a side-view light emitting diode package according to an embodiment of the present invention, and FIG. 6 is a perspective view of FIG. 5.

Referring to FIGS. 5 and 6, the reflectors 21a and 21b are positioned between the chip mounting region and each of the sidewalls 15w in a major axis direction of a package body to surround the chip mounting region. That is, the light emitting diode chip mounting region is surrounded by the reflectors 21a and 21b and sidewalls positioned in a minor axis direction of the package body.

The reflectors 21a and 21b may be integrally formed with the package body 15. The reflectors 21a and 21b may be spaced apart from each other and be connected to the package body 15. As shown in the figures, lower portions of the reflectors 21a and 21b may be connected to each other and upper portions of the reflectors 21a and 21b may be connected to an upper package body 15a. Alternatively, the reflectors 21a and 21b may be connected to each other in the form of a cup.

Figure 7:
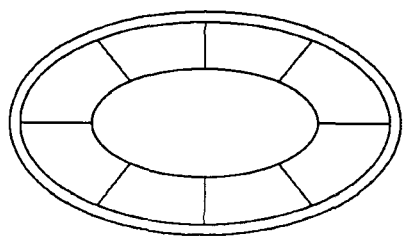
FIG. 7 is a plan views illustrating various shapes of reflectors used in a third exemplary embodiment of the invention.
Figure 7:
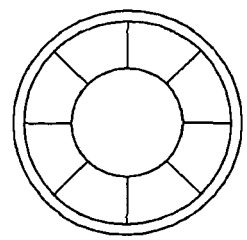
Figure 7:
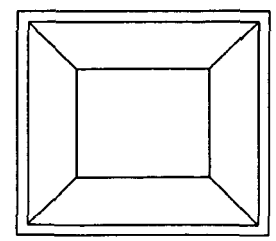

FIG. 7 (a) to (c) are plan views illustrating a variety of shapes of the reflectors 21a and 21b.

Referring to FIG. 7, the reflectors 21a and 21b have horizontal cross-sections each of which forms at least a portion of a circle (FIG. 7 (a)), an ellipse (FIG. 7 (b)) or a rectangle (FIG. 7 (c)). For example, in a case where the reflectors 21a and 21b are connected to each other to form a closed curved surface surrounding the light emitting diode chip mounting region, the horizontal cross-section of the reflectors 21a and 21b form the shape of a circular frame, an elliptical frame or a rectangular frame. And, in a case where the reflectors 21a and 21b are spaced apart from each other but connected to an upper package body 15a, the horizontal cross-sections of the reflectors 21a and 21b form both side portions of a circular frame, an elliptical frame or a rectangular frame.

Referring again to FIG. 4, the opening 16 may be filled with a transparent resin 23, e.g. an epoxy or silicone resin. The transparent resin 23 can contain phosphors for allowing the wavelength of light emitted from the light emitting diode chip 17 to be converted. A phosphor for converting light emitted from the light emitting diode chip 17, e.g. blue light, into yellow light may be contained in the transparent resin 23. Accordingly, a side-view light emitting diode package for emitting white light can be provided.

A side-view light emitting diode package according to embodiments of the present invention can improve light emitting efficiency by disposing the reflectors 21a and 21b between the light emitting diode chip mounting region and the sidewalls 15w positioned in the major axis direction of the opening 16. Further, the light emitting efficiency can be improved without narrowing a viewing angle by allowing each of the reflectors 21a and 21b to have a height lower than that of the sidewall 15w in the major axis direction of the opening 16.

Figure 8:
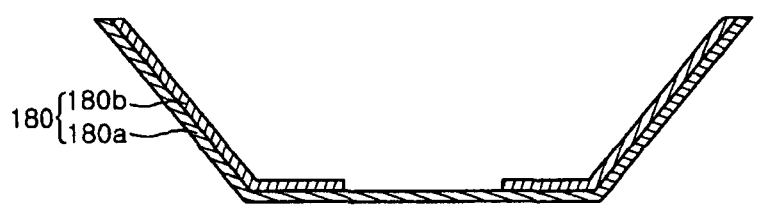
FIG. 8 is a sectional view illustrating a reflection surface of the side-view light emitting diode package according to a fourth exemplary embodiment of the present invention.

FIG. 8 is a sectional view illustrating a reflection surface of the side-view light emitting diode package according to an embodiment of the present invention. Here, for convenience of explanation, the side-view light emitting diode package in which the reflectors are connected to each other to form a reflection cup 180 will be discussed.

Referring to FIG. 8, the reflection cup 180 comprises a reflection cup body 180a and an oxide layer 180b formed on a surface of the reflection cup body 180a. At this time, the oxide layer 180b may not be formed at a position where a light emitting diode chip will be mounted.

The reflection cup body 180a may be formed of metal such as aluminum (Al) or silver (Ag) through a predetermined molding process or be formed of the same material as the package body 15, e.g. PPA (polyphthalamide). The light emitting diode chip is mounted on the center of the reflection cup body 180a. If the reflection cup body 180a is formed of a metallic material with good thermal and electrical conductivity, heat emitted from the light emitting diode chip can be rapidly transferred to the reflection cup 180.

The oxide layer 180b can be formed of an oxide with relatively high light reflectivity and relatively low thermal conductivity within a range of from ultraviolet rays to infrared rays, including at least one of MgO, $BaSO_4$, $SiO_2$ and $Al_2O_3$, for example. The oxide layer 180b serves to prevent the heat generated from the light emitting diode chip and transferred to the reflection cup body 180a from being collected inside the reflection cup, because the oxide layer 180b has the relatively low thermal conductivity. That is, the heat generated from the light emitting diode chip is radiated to the outside through the reflection cup body 180a brought into contact with the light emitting diode chip, and the interior of the reflection cup is thermally isolated by the oxide layer 180b. Therefore, the light emitting efficiency of a light emitting diode package can be improved since the temperature in the package is lowered as compared with a conventional reflection cup.

Furthermore, the oxide layer 180b defines a scattering reflection surface for scattering and reflecting light emitted from the light emitting diode chip. The scattering reflection surface can increase an amount of light exited from the light emitting diode package to the outside as compared with a mirror reflection surface, to thereby provide a package with relatively improved light emitting efficiency. In particular, MgO or $BaSO_4$ can further improve the light emitting efficiency due to relatively high reflectivity thereof.

The oxide layer 180b can be formed by dispersing MgO or $BaSO_4$ in the form of particulates into a solvent such as acetone or alcohol, coating a surface of the reflection cup body 180a with the MgO or $BaSO_4$ particulates dispersed in the solvent, and evaporating the solvent from the surface of the reflection cup body. At this time, a masking tape may be previously attached onto a portion of the reflection cup body 180a where the light emitting diode chip will be mounted, and the oxide layer 180b may be coated onto the surface of the reflection cup body 180a. Then, the masking tape may be removed after the oxide layer 180b has been formed.

In addition, the oxide layer 180b may be formed while the transparent resin 23 (FIG. 4) is formed. That is, the oxides in the form of particulates are contained in a curing resin and are then precipitated while the resin is cured, so that the oxide layer 180b can be formed.

On the other hand, when the reflection cup body 180a is formed of aluminum, a surface thereof is cleaned with hydrochloric acid (HCl) to remove impurities remaining on the surface and the hydrochloric acid (HCl) is then washed with water. Subsequently, the reflection cup body 180a is exposed to the air and then heated to a temperature of 100 to 150° C. to form a thermal oxidation film 180b made of $Al_2O_3$. At this time, the thermal oxidation film may be formed on only a region except the light emitting diode chip mounting region by forming the thermal oxidation film after forming a mask on a region where the light emitting diode chip will be mounted. Alternatively, the thermal oxidation film is formed over the entire area of the reflection cup body 180a, and the thermal oxidation film formed on the light emitting diode chip mounting region can be removed.

The oxide layer 180b can be formed not only on the surface of the reflection cup but also on at least a portion of internal surfaces surrounding the opening, for example, on sidewalls of the package body and the bottom of the opening.

Hereinafter, simulation results made for comparing the side-view light emitting diode package according to the present invention with the conventional side-view light emitting diode package in view of their light emitting performance are described. Herein, two types of side-view light emitting diode packages (model names of SWTS907 and SWTS905) available from Seoul Semiconductor Co., Ltd. were used as the conventional side-view light emitting diode packages. The heights H of SWTS907 (0.6 T) and SWTS905 (0.8 T) are 0.6 mm and 0.8 mm, respectively, and the heights of sidewalls of the upper package body 15a are 0.65 mm and 0.75 mm, respectively. In the meantime, it is assumed that the side-view light emitting diode packages according to the embodiments of the present invention are formed with reflectors therein. At this time, it is also assumed that the reflectors have a height of 0.25 mm, a lower inner diameter of 0.22 mm and an upper inner diameter of 0.4 mm.

Further, two types of light emitting diode chips (model names of XT-24 and XB-24) available from Cree, Inc. were used as light emitting diode chips. Xb-24 is a light emitting diode chip in which a light emitting diode is formed on a SiC substrate, and XT-24 is a light emitting diode chip in which a light emitting diode is formed on a SiC substrate which in turn is removed. Furthermore, it is assumed that each of the openings 16 of the side-view light emitting diode packages was filled with an epoxy resin.

Meanwhile, it is assumed for the simulation that the refractive indexes $n_{epoxy}$, $n_{air}$, $n_{SiC}$ and $n_{GaN}$ of an epoxy resin, the atmosphere, SiC and GaN are 1.5, 1.0, 2.55 and 2.5, respectively, and desired data are obtained from the traveling paths of 500,000 light beams. Furthermore, assuming that the package body and reflectors are formed of PPA (polyphthalamide) and the respective exposed surfaces of the light emitting diode package and the inner and outer wall surfaces of the reflectors are formed into mirror or scattering reflection surfaces, the simulation was made to obtain data for the total light flux and luminance of light emitted from the light emitting diode package.

Table 1 shows various kinds of combinations used in the simulation.

TABLE 1

| (Examples or Comparative Examples) | Packages | Light emitting diode chips | Reflection surfaces |
|---|---|---|---|
| Example 1 | 0.6T | XT-24 | Mirror surface |
| Example 2 | 0.6T | XT-24 | Scattering surface |
| Example 3 | 0.6T | XB-24 | Mirror surface |
| Example 4 | 0.6T | XB-24 | Scattering surface |
| Example 5 | 0.8T | XT-24 | Mirror surface |
| Example 6 | 0.8T | XT-24 | Scattering surface |
| Example 7 | 0.8T | XB-24 | Mirror surface |
| Example 8 | 0.8T | XB-24 | Scattering surface |

Referring to Table 1, the respective examples have the same combinations of the packages, light emitting diode chips and reflection surfaces as the comparative examples, and further comprise reflectors. The reflectors have the same reflection surfaces as the packages.

Simulation results of the total light flux, luminance and viewing angle of the examples and the comparative examples according to the aforementioned combinations are summarized in Table 2. It is assumed that the total light flux is measured by collecting all the light on a spherical surface surrounding the package and the luminance is measured using a luminance measuring instrument such as an LED430 adaptor. Furthermore, the viewing angle was indicated by a half of the total viewing angle.

TABLE 2

| | Total Light Flux (lm) | | | Luminance (mcd) | | | Viewing Angle (2θ ½°) | |
|---|---|---|---|---|---|---|---|---|
| | Compa. Example | Example | Rate of Inc. (%) | Compa. Example | Example | Rate of Inc. (%) | Compa. Example | Example |
| Ex. 1 | 3.326 | 4.147 | 24.7 | 16.2 | 18.6 | 15.2 | 68 | 70 |
| Ex. 2 | 4.663 | 4.709 | 1 | 15.2 | 17.9 | 17.7 | 105 | 95 |
| Ex. 3 | 3.294 | 3.739 | 11.3 | 7.9 | 9.4 | 18.9 | 95 | 95 |
| Ex. 4 | 4.268 | 4.326 | 1.3 | 9.7 | 11.3 | 16.5 | 120 | 110 |
| Ex. 5 | 4.178 | 4.608 | 10.3 | 14.9 | 21.5 | 44.3 | 100 | 80 |
| Ex. 6 | 4.792 | 4.758 | −0.7 | 16.2 | 18.2 | 12.3 | 100 | 92 |
| Ex. 7 | 3.845 | 4.131 | 7.4 | 8.3 | 11.1 | 33.7 | 100 | 100 |
| Ex. 8 | 4.373 | 4.405 | 0.7 | 11.4 | 13.7 | 20.2 | 115 | 110 |

Referring to Table 2, the total light flux was increased in almost all the examples as compared with the comparative examples. The luminance was further increased as much as at least 15% in the examples as compared with the comparative examples. However, the viewing angle was generally decreased in the examples, but the rate of decrease in the viewing angle was relatively smaller than the rate of increase in the luminance.

Figure 9:
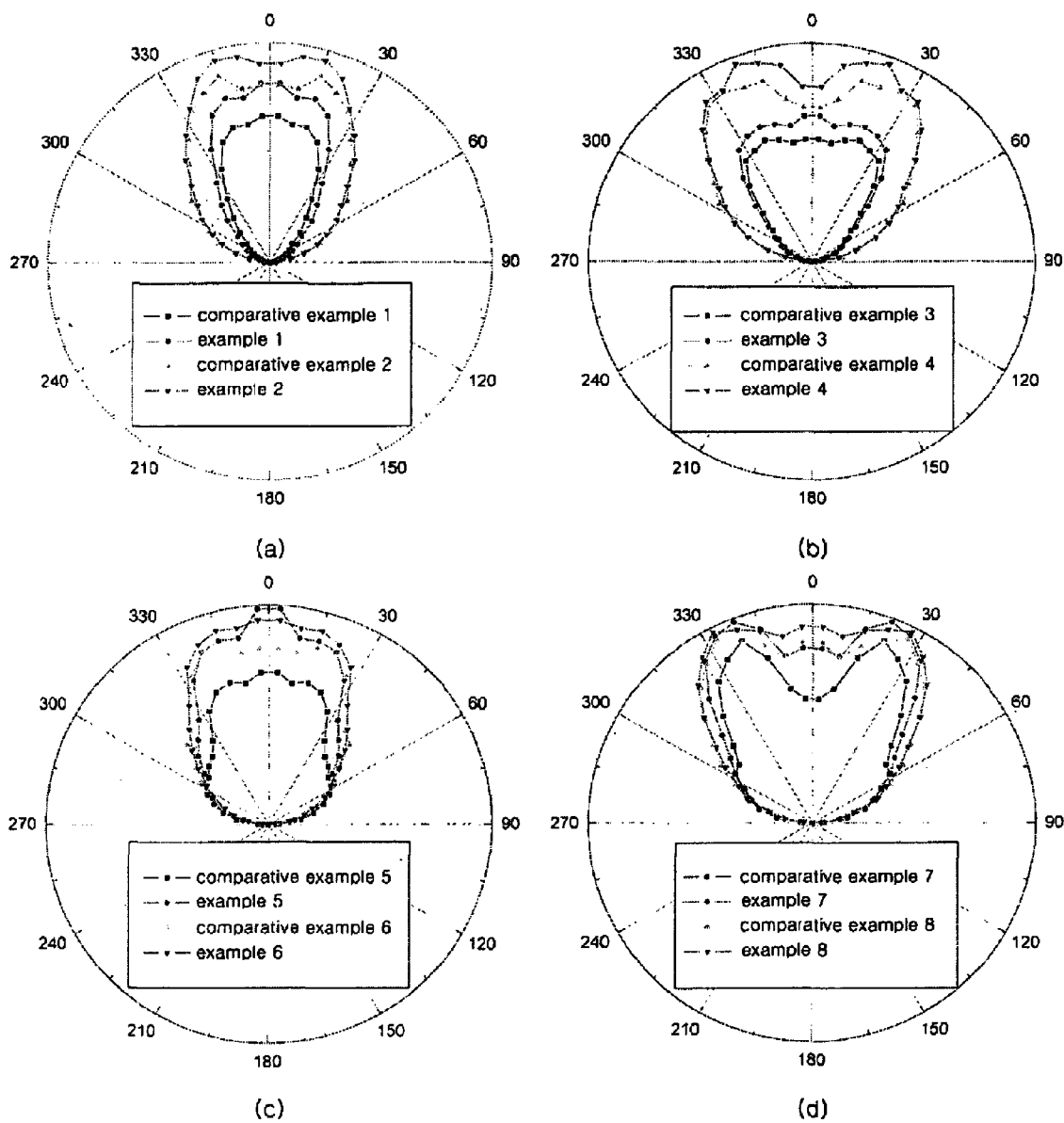
FIG. 9 (a) to (d) are graphs illustrating the spatial distribution of light depending on the reflectors according to a fifth exemplary embodiment of the present invention.

FIG. 9 is graphs plotting the simulation results of the distribution of light in the examples and the comparative examples according to the foregoing combinations.

Referring to FIG. 9 (a) to (d), in the same conditions, the spatial distribution of light was not narrower but generally wider in the examples as compared with in the comparative examples, and the luminance at most of viewing angles was relatively larger in the examples as compared with in the comparative examples. Furthermore, the packages with the scattering reflection surfaces had total light flux greater than the packages with the mirror reflection surfaces.

In conclusion, the reflectors provided in the packages allow the viewing angles to be slightly narrowed but the luminance to be increased relatively more than the decrease of viewing angle, and the total light flux was also increased considerably in the packages with the mirror reflection surfaces. Furthermore, the packages with the scattering reflection surfaces had light emitting efficiency higher than the packages with the mirror reflection surfaces.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A side-view light emitting diode package to laterally emit light emitted from a light emitting diode chip, comprising:
   first and second lead terminals spaced apart from each other;
   a package body to support the first and second lead terminals and comprising an elongated opening to expose a light emitting diode chip mounting region and the first and second lead terminals; and
   a plurality of reflectors arranged between the light emitting diode chip mounting region and sidewalls positioned in a major axis direction of the opening, each reflector comprising a height lower than that of the sidewalls,
   wherein each reflector is integrally formed with the package body, and
   wherein each reflector comprises aluminum or silver.

2. The side-view light emitting diode package of claim 1, wherein each reflector comprises a horizontal cross-section to form at least a portion of a circular frame, an elliptical frame or a rectangular frame.

3. A side-view light emitting diode package to laterally emit light emitted from a light emitting diode chip, comprising:
   first and second lead terminals spaced apart from each other;
   a package body to support the first and second lead terminals and comprising an elongated opening to expose a light emitting diode chip mounting region and the first and second lead terminals; and a plurality of reflectors arranged between the light emitting diode chip mounting region and sidewalls positioned in a major axis direction of the opening, each reflector comprising a height lower than that of the sidewalls, wherein each reflectors comprises an oxide layer arranged on a surface thereof.

4. The side-view light emitting diode package of claim 3, wherein the oxide layer comprises at least one oxide selected from the group consisting of MgO, $BaSO_4$, $SiO_2$ and $Al_2O_3$.

5. The side-view light emitting diode package of claim 3, wherein the oxide layer comprises precipitated oxide particulates.

6. A side-view light emitting diode package to laterally emit light emitted from a light emitting diode chip, comprising:

first and second lead terminals spaced apart from each other;

a package body to support the first and second lead terminals and comprising an elongated opening to expose a light emitting diode chip mounting region and the first and second lead terminals, and an oxide layer arranged on at least a portion of inner surfaces surrounding the opening; and a plurality of reflectors arranged between the light emitting diode chip mounting region and sidewalls positioned in a major axis direction of the opening, each reflector comprising a height lower than that of the sidewalls.

7. The side-view light emitting diode package of claim 6, wherein each reflector comprises an oxide layer on a surface thereof.

8. The side-view light emitting diode package of claim 7, wherein the oxide layer comprises at least one oxide selected from the group consisting of MgO, $BaSO_4$, $SiO_2$ and $Al_2O_3$.

9. The side-view light emitting diode package of claim 1, further comprising a light emitting diode chip arranged on the chip mounting region, wherein the light emitting diode chip is coupled to the first and second lead terminals.

10. The side-view light emitting diode package of claim 9, wherein the light emitting diode chip is arranged on the first lead terminal.

11. The side-view light emitting diode package of claim 3, wherein each reflector comprises a horizontal cross-section to form at least a portion of a circular frame, an elliptical frame or a rectangular frame.

12. The side-view light emitting diode package of claim 3, wherein the reflector comprises the same material as the package body.

13. The side-view light emitting diode package of claim 1, wherein each reflector comprises an oxide layer arranged on a surface thereof.

14. The side-view light emitting diode package of claim 13, wherein the oxide layer comprises at least one oxide selected from the group consisting of MgO, $BaSO_4$, $SiO_2$ and $Al_2O_3$.

15. The side-view light emitting diode package of claim 13, wherein the oxide layer comprises precipitated oxide particulates.

16. The side-view light emitting diode package of claim 6, wherein the reflector comprises the same material as the package body.

* * * * *